United States Patent
Todisco et al.

(10) Patent No.: US 6,319,747 B1
(45) Date of Patent: Nov. 20, 2001

(54) PROCESS FOR PRODUCING A THIN-FILM SOLAR MODULE AND SEPARATING MEANS FOR USE IN THIS PROCESS

(75) Inventors: Alexandra Todisco, Riedstadt; Dieter Bonnet, Friedrichsdorf; Peter Dinges, Frankfurt, all of (DE)

(73) Assignee: ANTEC Solar GmbH, Arnstadt (DE)

(*) Notice: Subject to any disclaimer, the term of this patent is extended or adjusted under 35 U.S.C. 154(b) by 0 days.

(21) Appl. No.: 09/521,694

(22) Filed: Mar. 9, 2000

(30) Foreign Application Priority Data

Mar. 29, 1999 (EP) .................................... 99106372

(51) Int. Cl.⁷ .................................................. H01L 21/00
(52) U.S. Cl. ............................. 438/94; 438/48; 136/258; 136/260; 136/264; 33/18.1
(58) Field of Search ........................ 438/94, 48; 136/260, 136/258, 264; 33/18.1

(56) References Cited

U.S. PATENT DOCUMENTS

| | | | |
|---|---|---|---|
| 3,138,875 | 6/1964 | Christensen | 33/18 |
| 4,243,432 | 1/1981 | Jordan et al. | 136/244 |
| 4,315,096 | 2/1982 | Tyan et al. | 136/244 |
| 4,502,225 | 3/1985 | Lin | 33/18 |
| 4,589,194 | * 5/1986 | Roy | 29/583 |
| 5,304,499 | 4/1994 | Bonnet et al. | 438/94 |
| 5,501,744 | * 3/1996 | Albright et al. | 136/258 |

FOREIGN PATENT DOCUMENTS 27 51 272 A  5/1978 (DE) ................ H01L/21/316

OTHER PUBLICATIONS

Ebong, A. U. et al., "Mechanically Grooved Double Sided, Buried Contact Silicon Solar Cells" *Renewable Energy*, vol. 11, No. 3, pp. 331–340 (1997).

Bonnet, D. et al., "Produktion Von Duennschichtsolarzellen" *Elektrotechnik Und Informationstechnik*, Bd. 115, Nr. 11, pp. 608–615 (1998) (English Translation Enclosed).

Ebong, A. U., "Adaption of Drafting Plotter For Buried Contact Groove Formation" *Solar Energy*, vol. 57, No. 3, pp. 185–193 (1996).

* cited by examiner

*Primary Examiner*—Charles Bowers
*Assistant Examiner*—Hsien-Ming Lee
(74) *Attorney, Agent, or Firm*—Quarles & Brady LLP (57) ABSTRACT

Process and separating means for the production of a thin film solar module (10) comprising a plurality of solar cells (11) arranged side-by-side on a common substrate (12), which are produced by employing a plurality of layer deposition steps and layer separating steps during the course of cell production and which are electrically interconnected with one another, wherein after the application of a first contact layer (14) on substrate (12) and the cell-wise separation thereof a pn double layer (16) is applied on a contact layer and, thereafter, is mechanically separated in that a scraping cutting tool serving as separating means scrapes, by a relative movement to the coated substrate, a cell structure into said pn double layer, wherein said cutting tool slides, preferably without being raised or rotated, with a plane sliding surface of a flattened tip on said first contact layer (14) which has a higher hardness than said pn double layer (16).

22 Claims, 6 Drawing Sheets

PROCESS FOR PRODUCING A THIN-FILM SOLAR MODULE AND SEPARATING MEANS FOR USE IN THIS PROCESS

CROSS REFERENCES TO RELATED APPLICATIONS

Not Applicable

STATEMENT REGARDING FEDERALLY SPONSORED RESEARCH

Not Applicable

BACKGROUND OF THE INVENTION

The present invention relates to a process for producing a thin-film solar or photovoltaic module as well as to separating means for use in this process.

One possibility for producing thin-film solar modules or thin-film photovoltaic modules comprising a plurality of solar or photovoltaic cells disposed in parallel on a common substrate, which are produced and electrically interconnected by a plurality of cell-overlapping coating steps and coating-separation steps during cell production has already been described in U.S. Pat. No. 4,243,432. In that specification, CdS—$Cu_xS$ solar cells are produced in that a glass substrate is always completely provided with deposited individual layers, one upon the other. The layers in form of thin films mainly comprise a hard contact layer of $SnO_x$ serving as the lower electrode and a pn double layer of CdS—$Cu_xS$ disposed on it as well as a further contact layer serving as the upper electrode. Cuts performed between the individual thin film deposition steps have been provided to subdivide the cell-overlapping substrate film coating into individual cells, on the one hand, and to electrically series-connect the cells of a substrate, on the other hand. For serial interconnection of the cells, the cuts are provided such that the upper electrode of a cell 1 contacts the lower electrode of following cell 2, however, is separated from the upper electrode of cell 2. This scheme is continuously repeated over the whole substrate length. Various methods for separating the individual layers have been suggested in this U.S. patent, inter alia by ultrasonic techniques, and it has been stated that the pn layer may also be separated for instance by means of a rotating or a non-rotating cutting tool.

In U.S. Pat. No. 4,315,096, a similar process has been disclosed for CdTe and CdS layers wherein the separation cuts having a width of between 5 μm and 100 μm are also produced either by mechanical methods not defined in detail or by means of laser beams. U.S. Pat. No. 5,501,744, also, refers to the production of CdTe and CdS solar cells. According to U.S. Pat. No. 5,501,744, the modules are processed by means of a tool head which is movable both in transversal and longitudinal direction relative to the substrate. The tool head includes lasers, arranged side by side, sandblast blowers or deposition means which are obliquely directed to the substrate and, preferably, do not contact the substrate. After processing the substrate in longitudinal direction, the head is displaced in transverse direction to a new starting position for longitudinal movement. During the course of this transverse movement, the processing units are not activated.

As yet, however, commercially traded silicon solar cell modules have not, as a rule, been fabricated in accordance with the above process of U.S. Pat. No. 4,243,432. Rather, they have been made of individual cells which are interconnected by means of soldered-on metal strips. Modules comprising CdS—$Cu_xS$ solar cells have not so far been produced on an industrial scale in accordance with the above-referenced process of U.S. Pat. No. 4,243,432. The same applies to CdS/CdTe solar cells which have, for a considerable time been considered as promising and which include a front contact of a transparent TCO layer, mostly in the shape of a so-called ITO layer. As to the production and the structure of such an individual solar cell, explicit reference is made to European Patent No. EP 0,535,522, which corresponds to U.S. Pat. No. 5,304,499.

BRIEF SUMMARY OF THE INVENTION

The present invention provides a process for producing a thin film solar module which is characterized in that a scraping tool as cutting or separating means for the pn layer is used. Contrary to common cutting means, the cutting tool employed in accordance with the present invention includes a flattened tip and the plane flattened surface serves as sliding surface of the tool. During the separating process, the tool is guided so that it slides with its plane sliding surface on the first contact layer while the sliding surface rests with its complete flattened face on this layer which is in parallel to it. The longitudinal axis of the tool is in this case perpendicular to the contact layer, or the substrate, respectively. By this design and arrangement, the danger of damage to the contact layer by the plane sliding surface of the tool is reduced to a minimum. The adjustment of the pressing force exerted on the tool is substantially uncritical. The force may, without any danger, be adjusted at such a high value that the pn double layer is safely cut through. It is not necessary to provide for any sophisticated regulations and adjustments for the scribing or scraping depth of the tool. In addition, the tool may without any complicated adjustment be moved in any direction and may for instance follow a meander-shaped path without any need of being axially rotated before being forwarded to a new work area and before being moved in a new processing or cutting direction.

Contrary to the normally common technique of the application of non-rotating cutting tools such as raising and lowering tools, the cutting tool of the process according to the invention need not to be raised from the coated substrate, neither during the cutting process nor when shifting the tool to a new work area. By avoiding a time consuming raising and lowering of the tool on and from the front contact layer, respectively, it was possible to increase the life time of the cutting tool and to enhance the efficiency of the process.

It was an object of the present inventors to provide a process by which an efficient production of thin film solar modules is possible while making use of cell-overlapping thin film deposition and a rapid and safe separating technique. A further object was to develop suitable separating means for the production of thin film solar modules, which make such rapid and, at the same time, safe separation possible. Rapid separation is necessary because the separation steps are part of the continuous production process and cannot be decoupled from it. During the course of the separation process, in addition, it should be ensured that the desired layers are sufficiently completely cut through and separated while the layers or thin films disposed under them remain undamaged.

The prior art scribing tools which are drawn, in an inclined position and without a parallel sliding surface, over a substrate do not show the advantages described above. U.S. Pat. No. 4,502,225 uses a scribing tool which is moved under an oblique angle of preferably 75° relative to the horizontal (so-called back racking angle) over a substrate in order to separate silicon layers. The tool preferably includes a rounded diamond tip. As alternatives for the obliquely disposed tool, pyramid-like or truncated tips have been referred to. According to this U.S. patent, the pressure adjustment of the tool and of its sharp scribing tip having a preferred diameter of about 0.01 mm is very critical. In order to obtain a defined scribing depth of the inclined tool rounded-off at the tip into the layer to be cut while not damaging the underlying layer, the pressing force is adjusted to tight limits using a complicated mechanical facility. One tries to monitor successful layer separation by means of resistance measurements, an action which can be ruled out in the case of electrically not conducting layers. After cutting a layer segment over the whole substrate length, the tool is raised and shifted into the new scribing position where it is lowered again. The oblique scribing tool shown can be moved in one direction only.

U.S. Pat. No. 4,589,194 shows also a scribing stylus guided in an inclined position relative to the substrate surface which as an alternative to the preferred diamond tip may optionally be produced completely of a hard metal. Amorphous silicon layers and back contact layers disposed thereon are cut. In order to avoid that the TCO layer disposed underneath be damaged by the sharp tool tip of only 0.006 mm diameter maximum as well as by the relatively high pressing forces as revealed, the Si layer is not completely cut but rather only so far that a certain thickness of the Si layer remains on the TCO layer. It is for this reason that the stylus has to be adjusted very sensitively. The stylus tip is ultrasonically driven. For shifting to a new scribing position, the inclined stylus is raised from the substrate.

As compared to these scribing tools which have to be drawn in an inclined position over the coated substrates, the adjusting measures on the scraping tool of the present invention with its sliding surface parallel to the substrate are considerably less complicated. In addition, the scraping tool may without being raised, be moved at a high speed and in a precise and stable movement into various directions. The tool according to the invention is guided perpendicularly over the thin film carrying substrate and slides with its sliding surface perpendicular relative to its longitudinal axis safely and gently on the harder contact layer and separate the overlaying layer reliably and completely.

The process of the invention is particularly suited for such CdS/CdTe solar cells as referred to having a front contact of a hard and smooth TCO layer such as the ITO layer which is about ten times harder than the soft, brittle pn layer. Thereby, it is possible to cut the pn layer while not penetrating into the front contact material on which the cutting tool slides with its flattened tip when cutting the pn layer. The process is particularly efficient since the cutting tool need not be raised before moving it on to a new starting position. It is only shifted in a second transverse moving direction to reach a new starting position before it is moved in a now-changed, generally opposite, longitudinal processing direction over the substrate. In this manner, the tool follows a meander-shaped path: It is moved in a first longitudinal direction over the whole module length, shifted in a transverse second moving direction in a marginal region of the module and moved in a longitudinal direction opposite to said first longitudinal direction. With a view to an efficient procedure, this present advantage cannot not be obtained by using cutting tools having a rotating cutting head or cutting tools periodically raised from, and lowered to, the substrate. This also applies to the above-described scribing tools that have to be guided in an inclined position.

Users who do not wish to shift the tools within a marginal area of the modules in said second transverse moving direction without raising the tool before it reaches a new starting position, may of course accept the prolongation of the process caused by the raising and lowering of the tool. When arranging a sufficient number of tools in parallel side-by-side in order to process the complete module in one working step, raising and lowering during module coating does not apply anyway.

Since preferably the whole substrate is provided with the pn layer, the cutting tool when being shifted in said second moving direction cuts the pn layer and slides on the front contact layer within a marginal region of the substrate. The process also covers a case in which the cutting tool is shifted in the second moving direction in an edge area of the substrate, which is not provided with a pn layer on the front contact layer.

When shifting on in the second transverse moving direction, it is not the first cutting edge of the cutting tools which is used but rather a different tool side which is moved facing the second moving direction. After having been shifted to a new starting position, the cutting tool which is preferably provided with a rectangular sliding surface is moved, preferably again without being raised and without being rotated about its longitudinal axis, opposite to the first moving direction.

It is of a constructional advantage to perform the relative movement in the first moving direction during which the pn layer is cut by only moving the cutting tool, or the cutting tools, respectively, over the substrate.

Preferably, the cutting tool is resiliently pressed with its sliding surface against the thin film carrying substrate. Sophisticated adjustment measures of fixedly chucked cutting tools as required in conventional workpiece processing techniques are not necessary. By means of the cutting tool of the invention resiliently pressed against the front contact layer, the pn layer is always reliably cut.

By further optimizing the operation of the cutting tool, it was possible to make the process still more efficient since at the beginning of the cutting tool operation, a tool is used the tip flattening of which has a considerable small value which in view of abrasion increases during the operation period or tool life. In the process, the operation period is limited so that flattening and increase of the plane sliding surface remains within a tolerable range in which the tool still continues to cut sufficiently. As compared thereto, the initial tip flattening is rather small at the beginning, however, already so large that the tool tip slides on the first contact layer without damaging it. In this connection, the pressure force of the tool depending on the adjusted spring force plays a role as well. Preferably, the pressure force is increased with the abrasion-caused increase of the area of the flattened tip in order to constantly produce a constant uniform optimum pressure. The force exerted by the spring is adjusted so that, on one hand, the first contact layer is not damaged and, on the other hand, sliding-up of the tool is avoided. In the production plant, the pressure force of the tools of the invention was adjusted only twice within a week while the tools were in uninterrupted operation.

The cutting means of the invention as characterized by claim 10 constitutes a cutting tool which is simple and economical to produce. Based on these properties, the exchangeable tool is suitable for the aimed-at mass production of thin film solar modules. The tool preferably includes the features characterized in claims 12 through 16.

It has been found that particularly large separation distances of up to 20 km could be obtained by using a rectangular sliding surface and preferably unequally long cutting edges without having to exchange the tool and to interrupt the production process. Furthermore, it is possible to work with a tip of the kind of an inverted four-sided truncated pyramid as tool tip by which, under equal cutting conditions, the first moving direction, or main scraping direction, is reversible.

It has also been found that by using the unequally long cutting edges, in the main scraping direction and in the moving or shifting direction preferably rectangular thereto an optimum relation of the force to be applied onto the cutting tool and the surface pressure can be obtained. The cutting tool according to the invention has the additional advantage that even in case of a slightly oblique or angular run satisfactory cuts are made while, in addition to the cutting edge in the main scraping direction, the cutting edge in the moving or shifting direction comes into operation. Thereby it is possible to provide for parallel cuts on the substrate without the need of complicated readjustments of the relative angular orientations of substrate and tool.

Adjustment, mounting and movement of the tool perpendicular on the substrate can be obtained with little mechanical endeavors.

In the case of a CdS/CdTe pn double layer wherein the CdS layer has a thickness in the range of only 100 nm or less, the thin CdS layer adheres so strongly to the first contact layer that it is not removed by the cutting tool. Since, however, the CdS layer is so thin, it practically shows the hardness of the hard first contact layer underneath. For the flattened tool tip, therefore, identical sliding conditions are obtained. In case of thicker CdS layers, their brittleness becomes more and more evident so that they are removed together with the CdTe layer.

BRIEF DESCRIPTION OF THE DRAWINGS

In the following, the invention will be explained in more detail based on the drawings wherein.

DETAILED DESCRIPTION OF THE PREFERRED EMBODIMENTS

Figure 1:
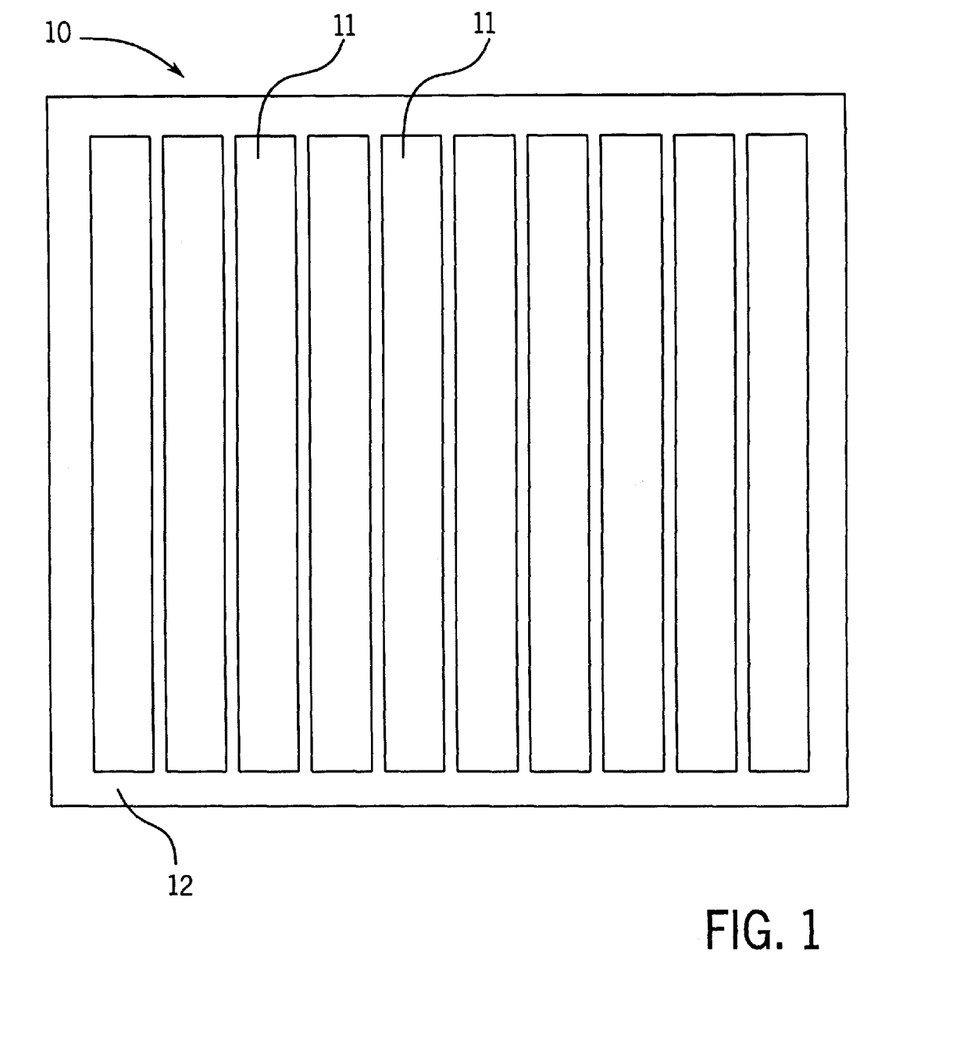
FIG. 1 is a diagrammatic top view of a thin film solar module having an edge zone freed from conductive material.

Thin film solar module 10 of FIG. 1 shows ten solar cells 11 on a glass substrate arranged in parallel side-by-side after the separation of the pn layer (preferably CdS/CdTe layer) before the application of the back contact layer. A typical module includes about 100 individual cells per meter of its length. For the structuring of the module, therefore, a plurality of longitudinal cuts over large cutting lengths have to be performed.

Figure 2:
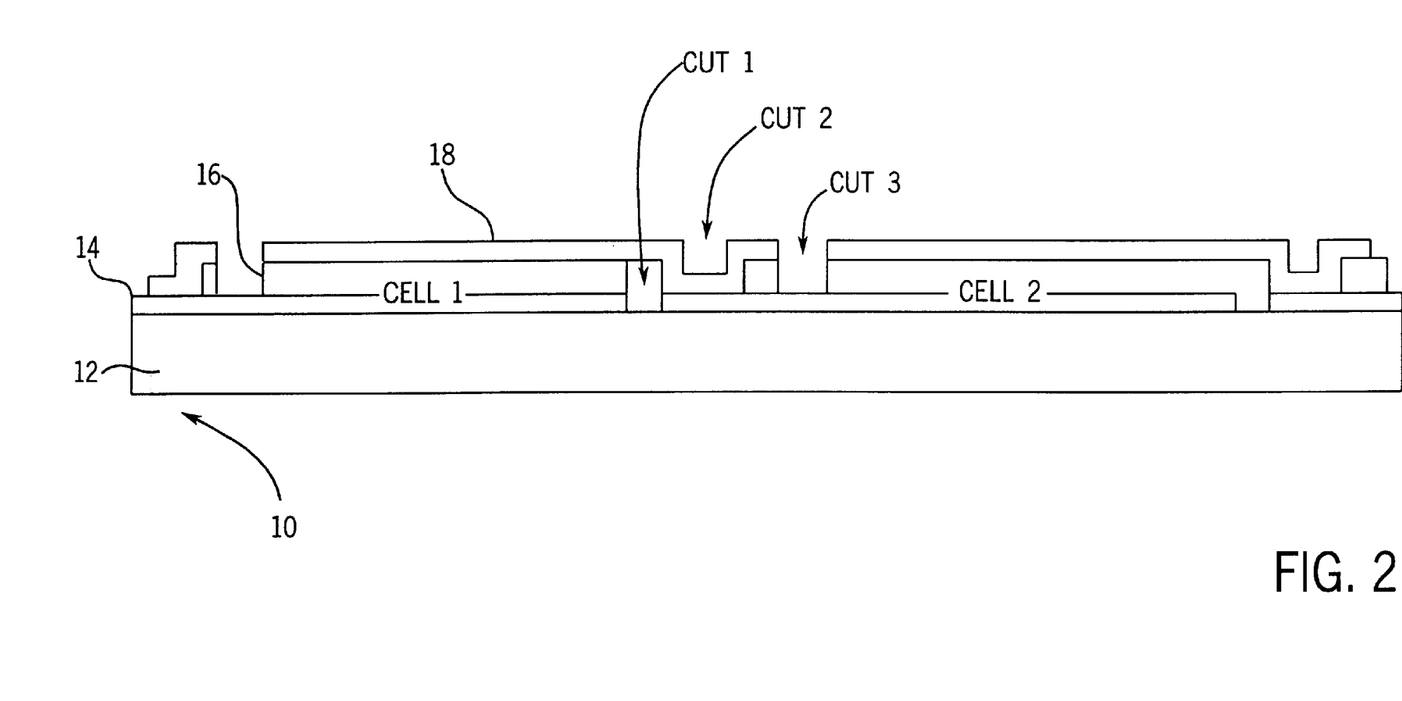
FIG. 2 is a cross sectional view through a portion of the module of FIG. 1.

The sectional view of FIG. 2 shows substrate 12 with back contact 18 applied. On glass substrate 12 consisting preferably of soda-lime glass, there is a TCO layer 14 which is cell-wisely separated and subdivided by cut 1. This cut which in the preferred embodiment is about 100 $\mu$m wide is generated through ablation by means of a laser, for instance a neodymium-YAG laser, after the application of the TCO layer. This first cut defines the width of the cells to be series-connected.

After the application of pn double layer 16, preferably by CdS deposition and subsequent CdTe deposition and activation of this layer, the cooled-off module is subjected to a cut 2 which constitutes a first mechanical separation cut by means of the cutting tool of the invention. The cut separates pn layer 16 near first cut 1 up to TCO layer 14. In the beginning, the width of the cut in the present embodiment amounts to about 0.06 mm which depends on the initial width of the tool and, especially, the flattened plane sliding surface thereof.

In a CdS/CdTe pn double layer wherein the CdS layer has a thickness in the range of only 100 nm or less as compared to the CdTe layer which is about 3 to 7 $\mu$m thick, the CdS layer is not removed as described above. The remaining CdS layer has only an insignificant influence on the function of the serial connection.

Subsequently, back contact 18 (preferably a double layer of a semiconductor layer, for instance tellurium, and a metal layer, for instance nickel) is vapor-deposited. Subsequently, cut 3 is made, again by means of the cutting tool of the present invention whereby back contact 18 and pn layer 16 are separated.

Cuts 1 through 3 extend in the longitudinal direction of strip-shaped cells 11 as in accordance with the representation in FIG. 1. Such longitudinal cut performed, the tool is shifted, while preferably in the still-coated substrate edge area, at right angles relative to the longitudinal direction of cells 11 without being raised nor being rotated about its longitudinal axis. Subsequently, the next longitudinal cut is made with the moving direction of the tool opposite to the preceding longitudinal cut. The tool is therefore moved in a meander or square wave shape relative to the substrate. The tool of the present invention allows cutting speeds of 30 meters per minute. In manufacture, when operating a plurality of parallel cutting tools a speed of only about 10 meters per minute is adjusted for the given modules.

During the course of the cutting or separating process, the cutting scrap is removed by suction. Cleaning of the substrate prior to the following coating step is not required.

As explained further above, series connection of the cells is obtained by connecting the back contact of cell 1 to the front contact, i.e. TCO layer 14 of cell 2, etc.

By using the inventional separation technique here described, the cells may, in principle, be interconnected in a different way as well.

Scraping cutting tool 30 shown in FIGS. 3 through 7 includes a tip 40 having the shape of an inverted truncated cone. In accordance with the preferred embodiment, the tool tip form is based on a four-sided straight pyramid having two differently long base edges 42 and 44 of lower base surface 41 of the truncated pyramid. These base edges constitute a first 42 and second 44 cutting edge of the tool. The side faces of the truncated pyramid extending from first and second cutting or base edges 42, 44 have differently large aperture angles α and β. These side faces form the true rakes of the tool. The first, smaller, angle α defines true rake 46 in a first main scraping direction of tool 30 and the second, larger, angle β defines the larger true rake 48 in a second scraping direction for shifting tool 30. The first angle α determines the cutting or scraping width of the tool which during the course of the wear caused by abrasion increases to a tolerable value.

In the preferred embodiment, angle a α=20° and angle β=70°. The shorter cutting or base edge 42 of rectangular sliding surface 41 which corresponds to the base surface of the truncated pyramid has, in the preferred embodiment, an original width of about 0.06 mm. The longer base edge corresponding to the selected angle is initially 0.24 mm wide. In the preferred embodiment, the maximum cutting width given by the module design amounts to about 0.1 mm. When operating tool 30, the respective true rake 46 forms in the preferred embodiment with the substrate plane, or the elongated sliding surface 41, an angle of γ=55° which becomes effective in the main scraping direction or the cell longitudinal direction. The larger true rake 48, on the other hand, forms with the substrate plane an angle of 80° which becomes effective in cell cross direction, i.e. the transverse shift direction for the tool. In this direction, separating capacity and cutting width of the tool in the pn double layer of the preferred embodiment are of no significance since after the application of back contact 18 and completion of the module, the layers on the edge zone of the substrate are completely removed. By such removal of the layers, the structures generated in the substrate layers by the movement of the tool in the transverse moving or shift direction are eliminated.

The above-given values of the sliding surface may be varied by those versed in the art if layers have to be removed which e.g. to permit broader separating strips. This applies for the angles as well. In the present preferred embodiment, however, the initial width of base edge 42 is generally not less than 0.02 mm.

Figure 3:
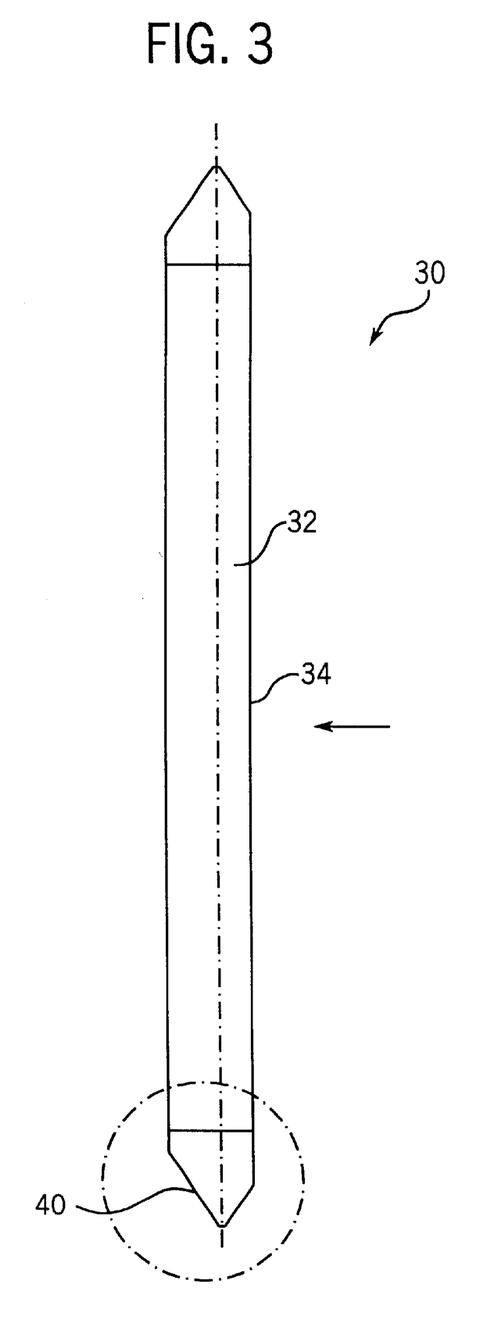
FIG. 3 is a lateral view of an example of a preferred embodiment of a scraping cutting tool according to the invention.
Figure 4:
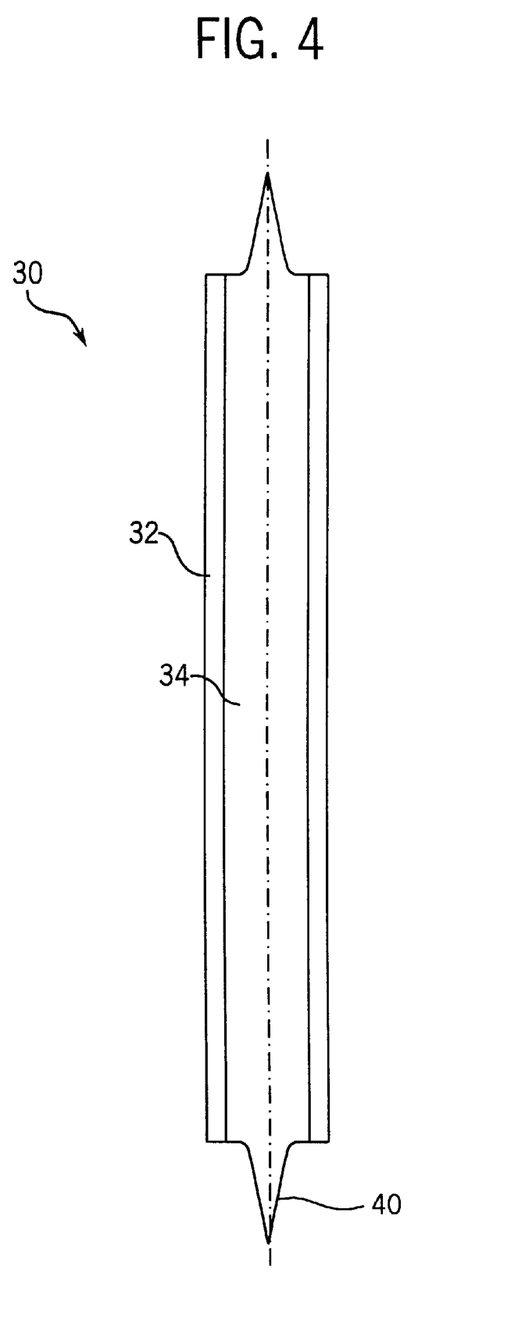
FIG. 4 is a lateral view of the cutting tool in the direction of the arrow of FIG. 3.
Figure 5:
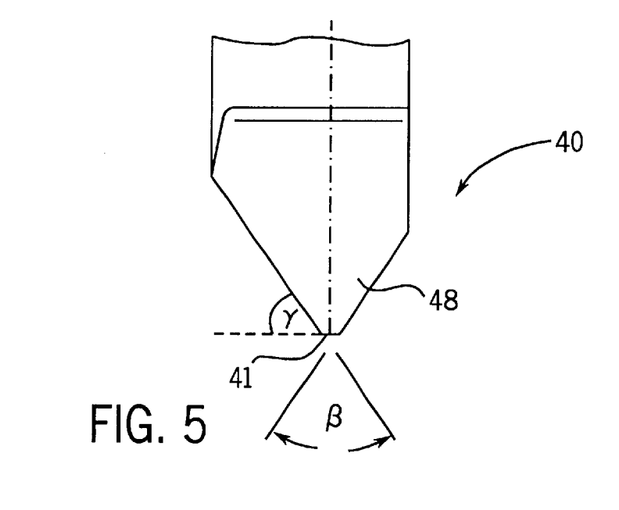
FIG. 5 is a view of the cutting tool tip enlarged relative to FIG. 3.
Figure 6:
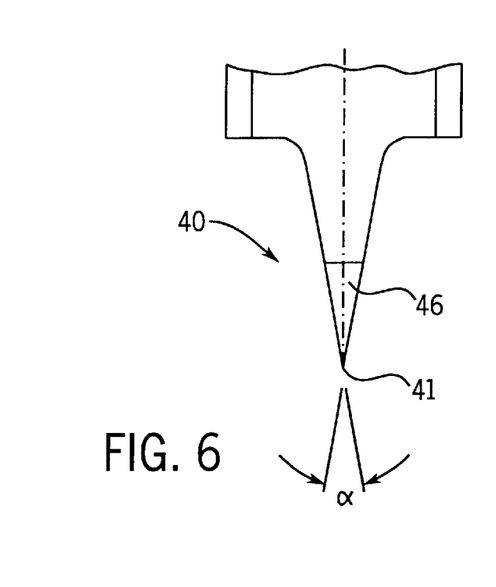
FIG. 6 is a view of the cutting tool tip enlarged relative to FIG. 4.
Figure 7:
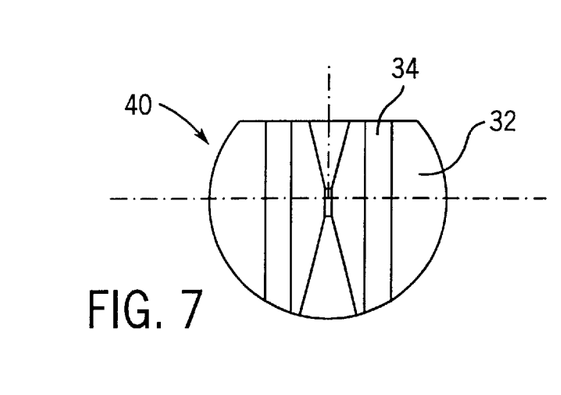
FIG. 7 again is a view of the cutting tool tip from the bottom enlarged relative to FIG. 4.
Figure 8:
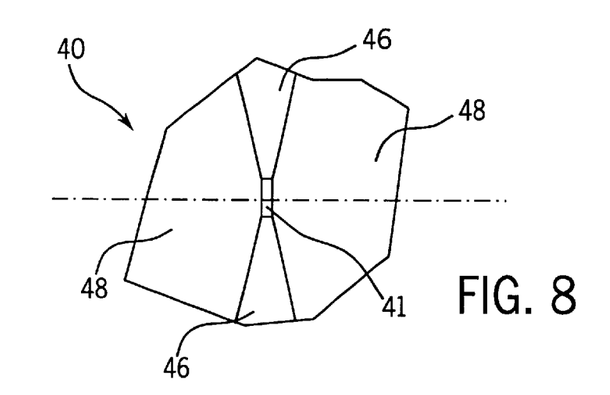
FIG. 8 is a partial view of the cutting tool tip enlarged relative to FIG. 7.

Truncated pyramid 40 passes over into a cylinder-shaped shaft 32 which as demonstrated is provided on one side with a plane guiding face 34.

In the embodiment as shown, furthermore, tool 30 is provided on both sides with a flattened tip 40 so that, when one tip is worn up, the other tip can be used. Because of the symmetric formation, the longitudinal axis of the tool, or the longitudinal axis of the tool tip, respectively, is disposed perpendicular relative to sliding surface 41.

Figure 10:
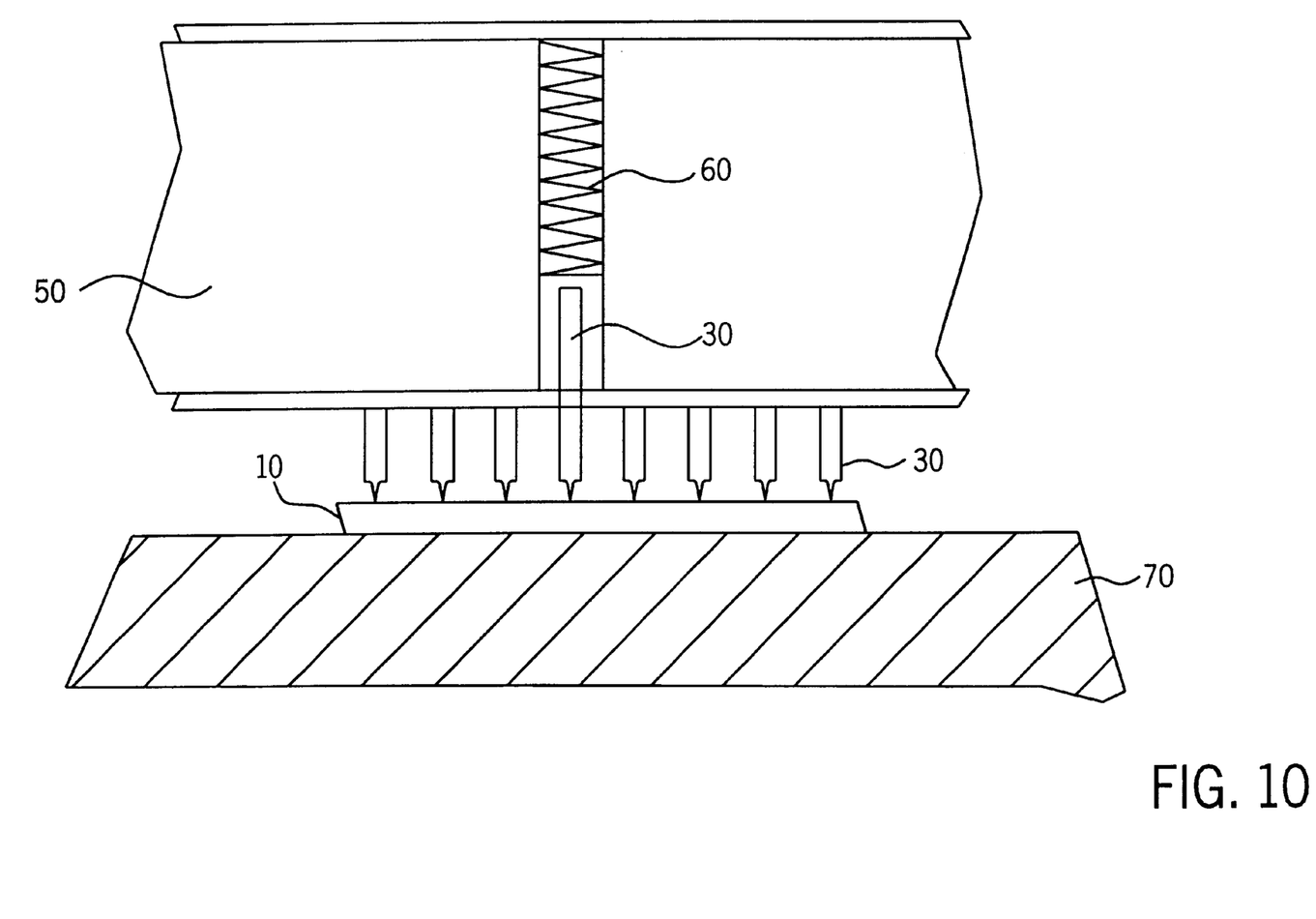
FIG. 10 is a diagrammatic lateral view of a tool holder with a plurality of cutting tools included in operational position above a module substrate arranged on a table.

FIG. 10 shows a tool holder 50 wherein a plurality of tools are incorporated. For the production plant, twenty tools were arranged on a length of 20 cm. The tools simultaneously process a plurality of cells arranged side-by-side on a substrate 10 which is fastened on a table 70. The table defines the X-Y plane for the relative movement of substrate/workpiece. A spring 60 acts on each individual tool 30 perpendicular to its sliding surface 41. Tools 30 are non-rotatably secured in a spindle sleeve each by means of guiding face 34 of the tool holder. The spindle sleeve is moveable in longitudinal direction. The tools are resiliently pressed against substrate 10.

The spring force is adjusted so that, on starting, the tool breaks through the layers to be separated from each other and during the course of the separating movement constantly slides on contact layer 40. As explained further above, the spring force is preferably increased with the increase of the sliding surface in order to maintain an approximately even pressure. For the materials and geometries of the preferred embodiment, a possible pressure range of some hundred N/mm² up to about 1000 N/mm² was found. By lowering the tool holder in Z direction, the springs, purchased from Federtechnik Knoerzer, Pfullingen, Germany, having various spring constants in the range from 1 to 10 were subjected to varying forces. Thereby, the pressing force of the tool tip to the substrate was preferably adjusted so that the pressure amounted to 500 N/mm². During a one-week operational run of tools 30, the force exerted was readjusted for about four to eight Newton in order to compensate for surface abrasion and the surface increase resulting therefrom.

In the preferred embodiment, tool holder 50 is moved, by means not shown, in the longitudinal direction of the cell. Between the process steps performed in opposite directions, the table is transversely shifted at right angles relative to the longitudinal direction of the cell corresponding to the number of the cells to be processed by the tools.

Figure 9:
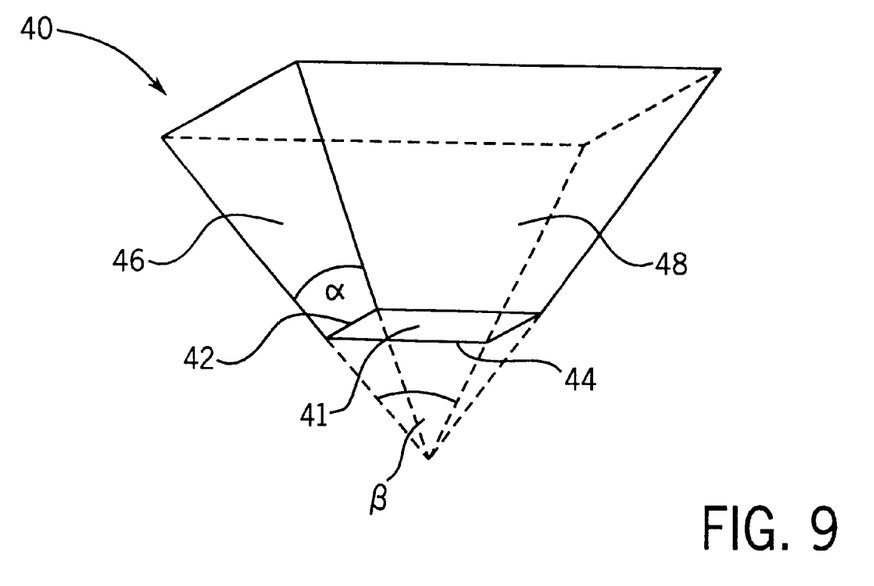
FIG. 9 is a diagrammatic perspective view from the lower end of the cutting tool tip.

It should be noted that the tool of the invention may be operated as well without the two moving directions described. A sufficient number of tools for all the cells of a substrate may, in principle, be arranged side-by-side in a holder so that, by one single longitudinal cut, structuring of each layer can be obtained. Particularly in this case, it would also be possible to use in the tool of the present invention a tip having the shape of a trilateral truncated pyramid. In principle, the tool tip of such an embodiment would need only one single cutting edge so that the flattened tool tip could also be half round in cross-section. In case of such geometrical embodiments of the tool tip it is also of advantage if the angle between the true rake (corresponding to surface 46 in FIG. 9) extending from the cutting edge (corresponding to edge 42) and the extension of flattened plane base surface 41 of the tool tip (or the sliding cutting plane, respectively) is between 40° and 90° corresponding to angle γ in FIG. 5.

Instead of the truncated pyramid as explained, an inverted truncated cone offers a further possible development of the tip of the tool according to the invention. Such shape is preferably used for the production of curved, for instance circular, cutting structures.

In the case of the truncated pyramid-shaped embodiment, the increase of the plane sliding surface width caused by abrasion decreases in the main scraping or cutting direction with smaller values of α. Thereby, the life time of the tool can be increased. The stability of the tool, however, is decreased, which by increasing β can be increased to a certain extent only. In the case of a preferred range of α of between 15° and 40°, values for β in the range of from 100° to 50° have proved to be suitable, which in the case of a given cutting edge ratio and a geometrically exact truncated pyramid can be calculated from the values of α. Depending on the material to be separated and the hardness of the front contact layer, those skilled in the art will, with a view to highest possible cutting speed and life time of the tool, find values which for their demands constitute the best possible compromise.

In this connection, those skilled in the art need not, as in the preferred embodiment, presume a geometrically exact straight four-sided truncated pyramid but may also combine such aperture angles wherein the extensions of the true rakes do not meet at a common tip. However, easier reproducible production of the tool is possible in case of a geometrically exact truncated pyramid. Furthermore, due to the constant cutting edge ratios in this case, it is also easier to calculate the surface increase caused by abrasion and the pressing force adaptation.

The sliding surface which is not equilaterally rectangular in the preferred embodiment can also be replaced by a square one. This will be of advantage if not only longitudinal cuts but also lateral cuts of even width have to be produced in a pn layer.

In the preferred embodiment, the cutting tool according to the invention consists of Widia steel (Type THM-U by Widia, Essen, Germany). In addition to other hard metals, a flattened diamond tool tip with a plane sliding surface would in principle also be suited.

What is claimed is:

1. Process for producing of a thin film solar module (10) including a plurality of CdS/CdTe solar cells (11) arranged side-by-side on a common substrate (12), which are produced by employing a plurality of layer deposition steps and layer separation steps during cell production and which are electrically interconnected with one another, characterized by
   (a) applying a first contact layer (14) on said substrate (12),
   (b) subdividing said first contact layer (14) into cells defined by a cell structure,
   (c) applying a pn double layer (16) of CdS/CdTe on said first contact layer (14), wherein said first contact layer (14) has a higher hardness than said pn double layer (16), and
   (d) mechanically separating said pn double layer (16) by using a scraping cutting tool (30) which serves as separation means for cutting by scraping the cell structure into said pn double layer, wherein said cutting tool (30) has a flattened tip (40) with a plane sliding surface (41) which engages said substrate (12), and said cutting tool (30) is moved relative to said substrate, wherein said cutting tool (30) is guided so that said plane sliding surface (41) engages said first contact layer (14) parallel to said substrate to scrape said cell structure into said pn double layer (16).

2. Process according to claim 1, characterized in that said cutting tool (30) is moved, without being rotated, in different directions relative to said layer carrying substrate (12) to reach new starting positions and to perform separations in different directions.

3. Process according to claim 1, characterized in that said cutting tool (30) is moved, without being raised, in different directions relative to said layer carrying substrate (12) to reach new starting positions and to perform separations in different directions.

4. Process according to claim 1, characterized in that after the application of a second contact layer (18) on said pn double layer (16), said second contact layer (18) is also separated together with said pn double layer (16) disposed underneath by means of said scraping cutting tool (30) along predetermined cutting lines, said flattened tool tip (40) sliding again on said first contact layer (14).

5. Process according to claim 1, characterized in that said pn double layer (18) is separated by a first cutting edge (42) of said cutting tool (30) in a first moving direction and that said cutting tool is shifted on said substrate in a second moving direction.

6. Process according to claim 5, characterized in that a cell group comprising a plurality of cells (11) arranged side-by-side is synchronously scraped and separated by a plurality of said cutting tools (30) guided in common in said first moving direction and subsequently shifted on to a next not-yet separated cell group in said second moving direction, preferably perpendicular to said first moving direction.

7. Process according to claim 5, characterized in that said relative movement in said first moving or cutting direction is accomplished by moving said cutting tool (30) and in said second moving or shifting direction is accomplished by moving said substrate (10).

8. Process according to claim 1, characterized in that said cutting tool (30) is resiliently pressed with its plane flattened tip (40) against said layer carrying substrate surface.

9. Process according to claim 1, characterized in that said cutting tool (30) with its cutting edge (42) initially having a minimum permissible width of its cutting edge is used until a maximum permissible width is reached due by the increase of the width due to abrasion.

10. Process according to claim 1, characterized in that in the case of a CdS/CdTe pn double layer wherein the CdS layer has a thickness within the range of only 100 nm, or less, said plane flattened tip (40) of said cutting tool (30) slides, instead of on said first contact layer (14), on the thin CdS layer deposited on said first contact layer (14).

11. Process according to claim 1, characterized in that at least one such scraping cutting tool (30) having said flattened tip (40) the flattening of which provides for a smooth plane sliding surface of said scraping cutting tool is used for mechanically separating said pn double layer (16).

12. Process according to claim 11, characterized in that at least one such scraping cutting tool (30) is used for mechanically separating said pn double layer (16), said tool having the shape of an inverted truncated pyramid with a smaller base surface (41), said smaller base surface forming said plane sliding surface.

13. Process according to claim 12, characterized in that at least one such scraping cutting tool (30) is used for mechanically separating said pn double layer (16) the sliding surface (41) of said tool having a first and a second cutting edge (42, 44) for a first and a second moving direction of said cutting tool (30), respectively.

14. Process according to claim 12, characterized in that the truncated pyramid-like shape is derived from a four-sided straight pyramid and that the lateral faces of said truncated pyramid extending from first and second cutting edges (42, 44), which constitute the true rakes (46, 48) of said cutting tool (30), have differently wide aperture angles ($\alpha$, $\beta$) and that the tool is guided such that a smaller angle ($\alpha$) is used for the main scraping direction and a larger angle ($\beta$) is used for the movement or shifting direction.

15. Process according to claim 1, characterized in that at least one such scraping cutting tool (30) is used for mechanically separating said pn double layer (16) said tool having a said sliding surface (41) being rectangular and having a smaller first cutting edge (42) for a first moving direction as a main scraping direction and a longer second cutting edge (44) for a second moving direction as shifting direction.

16. Process according to claim 1, characterized in that at least one such scraping cutting tool (30) having said flattened tip (40) the flattening of which provides for a smooth plane sliding surface of said scraping cutting tool and being made from hard metal is used for mechanically separating said pn double layer (16).

17. Process according to claim 16, characterized in that said hard metal is hardened metal alloy.

18. Process according to claim 1, characterized in that said cutting tool defines a longitudinal axis which is perpendicular to said plane sliding surface when mechanically separating said pn double layer.

19. Process according to claim 1, including (e) adjusting a pressure force exerted on said tool such that the force is increased with an abrasion-caused increase of the area of said plane sliding surface during the operation period of said scraping cutting tool (30).

20. Process according to claim 19, characterized in that said pressure force is adjusted in a pressure range of approximately 100 N/mm².

21. Process according to claim 19, characterized in that said pressure force is adjusted in a pressure range of no more than 1000 N/mm².

22. Process according to claim 19, characterized in that said pressure force is adjusted such that the first contact layer is not damaged and that sliding-up of the cutting tool with its plane sliding surface (41) is avoided.

\* \* \* \* \*

UNITED STATES PATENT AND TRADEMARK OFFICE
CERTIFICATE OF CORRECTION

PATENT NO.   : 6,319,747 B1  Page 1 of 1
DATED        : November 20, 2001
INVENTOR(S)  : Alexandra Todisco, Dieter Bonnet and Peter Dinges It is certified that error appears in the above-identified patent and that said Letters Patent is hereby corrected as shown below:

<u>Column 9,</u>
Line 62, replace "(18)" with -- <u>(16)</u> --.

Signed and Sealed this

Fourth Day of June, 2002

Attest:

Attesting Officer

JAMES E. ROGAN
*Director of the United States Patent and Trademark Office*